United States Patent [19]

Gillis et al.

[11] Patent Number: 5,719,879
[45] Date of Patent: Feb. 17, 1998

[54] SCAN-BYPASS ARCHITECTURE WITHOUT ADDITIONAL EXTERNAL LATCHES

[75] Inventors: Pamela Sue Gillis, Jericho, Vt.; Ravi Kumar Kolagotla, Breinigsville, Pa.; Dennis A. Miller, Jericho, Vt.; Maria Noack, Austin, Tex.; Steven Frederick Oakland, Colchester, Vt.; Chris Joseph Rebeor; Thomas Gregory Sopchak, both of Cambridge, Vt.; Jeanne Trinko-Mechler, Essex Junction, Vt.

[73] Assignee: International Business Machines Corporation, Armonk, N.Y.

[21] Appl. No.: 577,676

[22] Filed: Dec. 21, 1995

[51] Int. Cl.[6] .................................. G01R 31/28
[52] U.S. Cl. .............. 371/22.3; 371/22.31; 371/22.32; 365/201
[58] Field of Search ........................ 371/22.3, 22.1, 371/22.5, 22.4, 25.1, 22.31, 22.32, 22.34; 324/158 R, 765; 365/201; 395/183.06, 183.18; 364/715.11, 490

[56] References Cited

U.S. PATENT DOCUMENTS

| | | |
|---|---|---|
| 3,961,254 | 6/1976 | Cavaliere et al. . |
| 4,009,348 | 2/1977 | Tate . |
| 4,872,169 | 10/1989 | Whetsel, Jr. . |
| 5,048,021 | 9/1991 | Jarwala et al. ............ 371/22.3 |
| 5,056,093 | 10/1991 | Whetsel . |
| 5,084,847 | 1/1992 | Whetsel, Jr. . |
| 5,150,044 | 9/1992 | Hashizume et al. ........... 324/158 R |
| 5,257,267 | 10/1993 | Ishizaka . |
| 5,260,949 | 11/1993 | Hashizume et al. . |
| 5,329,533 | 7/1994 | Lin ............................. 371/22.3 |
| 5,331,643 | 7/1994 | Smith . |
| 5,430,735 | 7/1995 | Sauerwald et al. . |
| 5,448,575 | 9/1995 | Hashizume . |
| 5,448,576 | 9/1995 | Rusell . |
| 5,473,617 | 12/1995 | Farwell ...................... 371/22.3 |
| 5,477,545 | 12/1995 | Huang ....................... 371/22.3 |
| 5,491,666 | 2/1996 | Sturges ...................... 365/201 |
| 5,497,378 | 3/1996 | Amini et al. ............... 371/22.3 |

FOREIGN PATENT DOCUMENTS

| | | |
|---|---|---|
| 62-093672 | 4/1987 | Japan . |
| 4357477 | 10/1992 | Japan . |
| 5066244 | 3/1993 | Japan . |

OTHER PUBLICATIONS

Culican EF, Diepenbrock JC and Ting YM. Shift Register Latch for Package Testing in Minimum Area and Power Dissipation, *IBM Technical Disclosure Bulletin*, 24(11A):5598–5600.

McAnney WH. Bypass Latch Control Of Long Shift Register Strings. *IBM Technical Disclosure Bulletin*, 32(7):474–478.

Moser JJ. LSSD Scan Path Truncated To Minimum Length For Testing. *IBM Technical Disclosure Bulletin*, 25(12):6547–6549.

*Primary Examiner*—Robert W. Beausoliel, Jr.
*Assistant Examiner*—Nadeem Iqbal
*Attorney, Agent, or Firm*—Dressler, Rockey, Milnamow & Katz, Ltd.

[57] ABSTRACT

A scan architecture for testing integrated circuit chips containing scannable memory devices, such as register arrays, is operable in a bypass mode during which only a small portion of the memory cells in each device or array is inserted in the scan path to substantially reduce scan path length, test time and test data volume during testing of other logic components in the circuit chip. Additional decoder logic is employed to select a small number of words in the device or array during the scan-bypass mode, and multiplexor circuitry removes the bypassed words from the scan path. By leaving the small number of the register array words in the scan path, observability of logic upstream of the array, and controllability of logic downstream of the array, is preserved during the bypass mode without the need for additional shift register latches and other external logic components.

13 Claims, 3 Drawing Sheets

SCAN-BYPASS ARCHITECTURE WITHOUT ADDITIONAL EXTERNAL LATCHES

BACKGROUND OF THE INVENTION

The present invention relates in general to a method and apparatus for bypassing scannable memory devices, such as scannable register arrays, which eliminates the need for external shift register latches and other logic components.

As the packing density of integrated circuit chip devices has increased greatly in recent years, various schemes have been devised for providing increased testability of the devices. One particularly effective testing scheme employs level sensitive scan design (LSSD) in which chains of shift register latches (SRLs) are integrally formed in the device circuit to facilitate testing. The SRLs provide internal control points and observation points in the circuit to permit application of control test inputs to the circuit's various logic devices, and observation of the outputs which result from the inputs. The SRLs form a shift or scan path through which test data can be propagated.

In the operation of an LSSD testing scheme, a serial test data stream is first propagated through the scan path. A control pulse is then applied to the logic circuitry in the device to cause it to operate through one cycle using as input, the data in the SRLs at the various control points. The resulting serial data stream is then propagated out of the scan path to an external buffer where it is analyzed to determine if the digital values at the various observation points indicate that the logic circuitry is functioning properly. This procedure is repeated numerous times to ensure that all logic circuitry is tested.

Although the scan design testing scheme is very effective, the maximum scan path length, and therefore the maximum number of SRLs in the scan path, is limited by time constraints since the test data is propagated serially, and each SRL adds an additional scan cycle delay to the total time required for propagation of the test data through the scan path. Thus, the more SRLs that are added to the scan path, the longer the length of time required for the testing procedures. This becomes more and more of a problem as integrated circuit fabrication technology continues to improve and permit greater and greater packing density.

The current design of many memory device circuits also adds to the foregoing problem. More particularly, many memory devices, such as register arrays, are implemented with memory cells or bits that are each comprised of an LSSD L1/L2 latch, which facilitates connection of the array bits in the LSSD scan path. This permits the register array to be tested in the same manner as the logic circuitry, thereby eliminating the requirement for array test techniques, such as those using Array Built-In Self Test (ABIST), that require additional area for supplying test patterns from the test logic through the surrounding chip logic to the register array. However, the test time, volume of test data required behind each scan input, and number of I/Os that are consumed for scanning become prohibitively large if multiple scannable register arrays are provided on the same circuit chip, since each bit in the arrays forms part of the scan path length. This necessitates that a plurality of scan paths and associated I/O pins be provided on each chip to avoid exceeding a maximum allowable number of SRLs in each scan path. Unfortunately, each additional scan path requires the use of two additional I/O pins for applying and receiving signal data to and from the scan path. This can present a serious problem for I/O constrained designs, especially since the number of economic test function I/Os is limited.

One proposed solution to this specific problem presented by scannable memory devices, such as scannable register arrays, is to employ a bypass scheme wherein the bits of the register arrays can be selectively bypassed during testing to reduce the scan path length substantially. With the bypass scheme, circuit testing is performed in two modes. In the first, bypass mode, all logic surrounding the register arrays is tested using the reduced scan path length. Then, the circuit is placed in the non-bypass mode for the remainder of the test, during which only the register arrays are tested. The total time required for testing the circuit is thus substantially reduced since the scan path length is substantially shorter during the logic component testing, and only the array bits are tested during the non-bypass mode.

To bypass the register array, extra latches and multiplexors must be inserted to observe upstream logic and control downstream logic. A set of SRLs known as "listening latches" is thus introduced with one latch at each input of the register array. These listening latches are multiplexed with the register array outputs to preserve the observability of upstream logic and controllability of downstream logic during scan-bypass mode. Although this arrangement reduces the test time significantly, the number of listening latches and multiplexors needed by this scheme can be large if the number of inputs to and outputs from the register array is large. This increases the overall chip area necessary to implement the circuit. Also, the multiplexors introduce undesirable additional delay in the functional path from the register array.

SUMMARY OF THE INVENTION

To address the foregoing problem, the present invention provides an improved scan-bypass scheme that substantially reduces scan path length and circuit test time for circuits containing scannable memory devices, such as scannable register arrays, and does so without the requirement of any additional external logic devices, such as listening latches or multiplexors. This is achieved through use of circuitry which substantially reduces the apparent logical size of each memory device during the scan-bypass mode. More particularly, circuitry is provided which removes all but a selected small number of the data words in each memory device from the scan path during the scan bypass mode. The selected words are kept in the functional path during the scan, while the scan chain connecting the remaining words of the array is bypassed. Leaving the small number of selected words in the scan path during bypass mode serves the same purpose as the listening latches in the previous scheme by allowing the observability of upstream logic, and the controllability of downstream logic, however, it does so without the requirement for additional external SRLs or multiplexors. As in the previous scan-bypass scheme, all of the latches in each memory device are tested during a non-bypass mode of operation in which all of the words in each memory device are inserted in the scan path. The testing time and volume of data going to the tester are still substantially reduced during the non-bypass mode of operation since only the memory cells are being tested.

In a preferred embodiment of the present invention, additional decoder logic circuitry is employed to select only the small number of words in the memory device during the scan bypass mode. At the same time, the additional decoder logic prevents the bypassed words from being selected or addressed. Preferably, the additional decoder logic circuitry comprises a plurality of AND gates and an OR gate which logically combine the decoder select inputs with a bypass control signal. Switching devices, preferably multiplexors, are also provided which are responsive to the scan bypass control signal to implement the actual bypass of the latches in the scan path which correspond to the bits or cells of the bypassed data words in the memory device.

BRIEF DESCRIPTION OF THE DRAWINGS

The advantages and features of the present invention will become apparent from the following detailed description of a preferred embodiment thereof, taken in conjunction with the accompanying drawings, in which.

DETAILED DESCRIPTION OF THE PREFERRED EMBODIMENT

Figure 1:
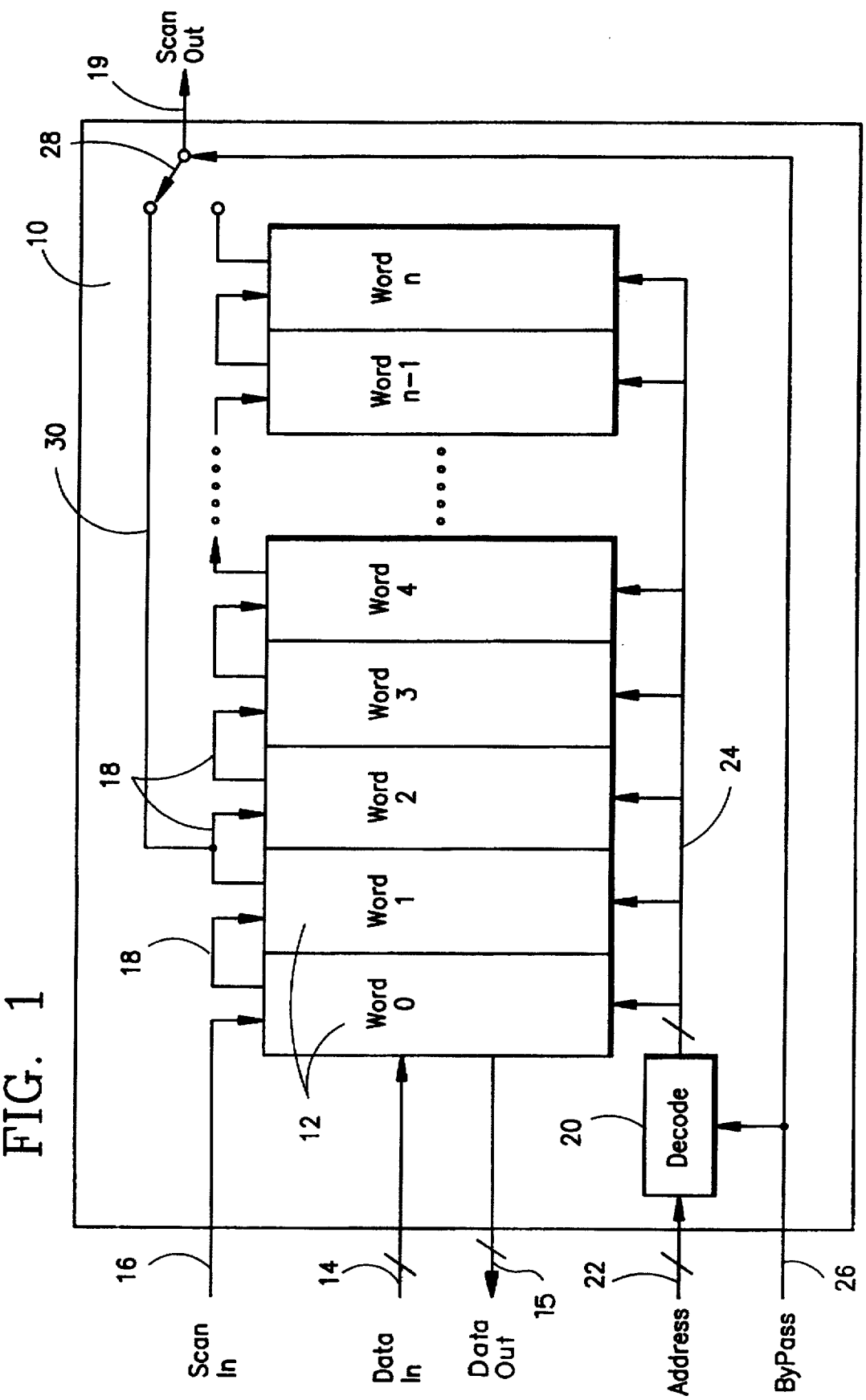
FIG. 1 is a general block diagram illustrating a generic implementation of the present invention.

FIG. 1 illustrates a generic scannable memory array device 10 which incorporates the scan-bypass architecture of the present invention. As is conventional, the memory device 10 comprises a plurality (n) of multiple bit data words 12 which receive data from a data in bus 14; and transmit data over a data out bus 15. Each of the data words 12 is comprised of a plurality of scannable shift register latches (SRLs), one for each bit, which enable the integrity of the memory array device 10 to be tested using a scan design testing method that treats the memory device 10 as if it were a random logic block circuit. For this purpose, a scan input line 16 from upstream SRLs (not shown) in a scan path is connected to the first of the data words 12 labelled Word 0 so that a test data stream can be shifted into and out of the data words 12. A plurality of scan out interconnection lines 18 is provided for interconnecting adjacent ones of the data words 12 to permit serial propagation of the test data stream through each bit of the memory device 10, and through a scan out line 19 to downstream SRLs in the scan path. As is also conventional, an address decoder circuit 20 is connected between an address bus 22 and a plurality of select lines 24, one for each of the data words 12, for selecting which of the data words 12 are to receive data through the data in bus 14, or transmit data through the data out bus 15.

The heart of the invention lies in the implementation of a bypass scheme which removes the majority, but not all, of the data words 12 from the scan path during testing of logic components upstream and/or downstream of the memory device 10 so that the scan path length, test time and test data volume are substantially reduced. To implement this scheme, the decoder circuit 20 incorporates additional logic circuitry. When the bypass mode is active, a bypass control signal is sent through a bypass control line 26 to the decoder circuit 20 which causes the logic circuitry therein to select or address a small number of the data words 12. In the example illustrated in FIG. 1, only the first two data words labelled Word 0 and Word 1 are selected during the bypass mode. The bypass control signal also causes a switching device 28, such as a multiplexor, to connect the scan output line 17 to a bypass line 30 which is connected directly to the scan output interconnection line 18 from Word 1. In this manner, the serial test data stream on the scan input line 16 propagates only through the plurality of latches forming Word 0 and Word 1, and is then directed through the scan bypass line 30 to the scan output line 19, and onto the downstream SRLs in the scan path. It is important that the decoder circuit 20 not select any of the bypassed data words during the bypass mode so that test data on the data bus 14 is not written into the bypassed words, and the data in the bypassed words is not transmitted on the data out bus 15, during testing. In addition, it is equally important that at least some of the data words be selected to provide the necessary observability of upstream logic components connected to the data in bus 14, as well as controllability of downstream logic components connected to the data out bus 15.

A non-bypass mode of operation is employed for testing all of the data words 12. During this mode, the decoder circuit 20 selects or addresses all of the data words 12 in the memory device 10, and the switching device 28 connects the scan output 19 from the last of the data words 12 (Word n) to the scan output line 19 so that all of the data words 12 are logically connected in the scan path.

Figure 2:
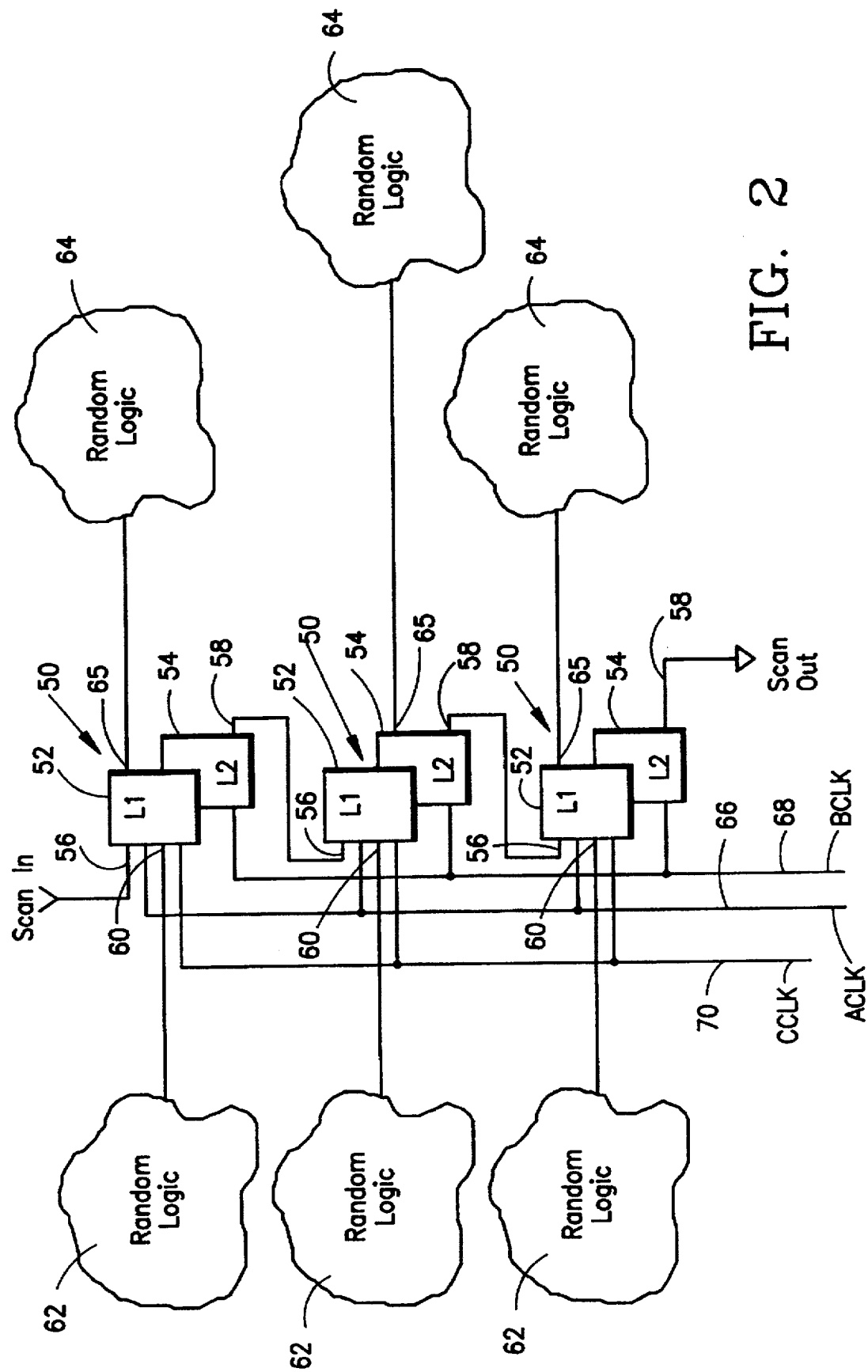
FIG. 2 is a diagrammatic illustration of a conventional LSSD logic testing scheme.
Figure 3:
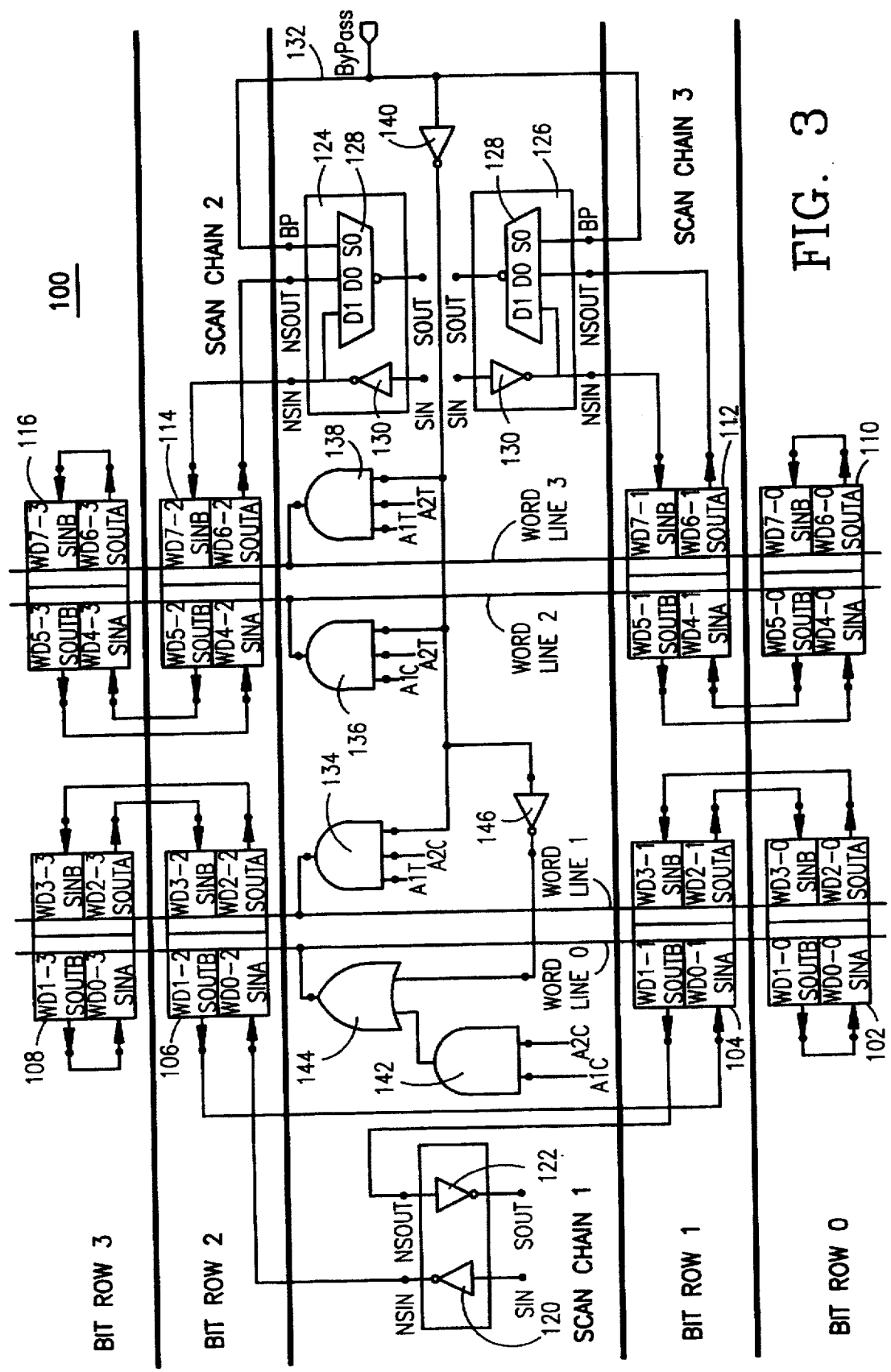
FIG. 3 is a logic block diagram illustrating a specific memory device design which is constructed in accordance with a preferred embodiment of the present invention.

FIG. 2 is a general illustration of a conventional LSSD scheme for testing random logic circuitry which can be employed for testing memory devices, such as those illustrated in FIGS. 1 and 3, that incorporate the scan bypass architecture of the present invention. The testing scheme employs a scan path comprised of a plurality of scannable L1/L2 SRL latches 50, three of which are illustrated in FIG. 2. The total number of the latches 50 in the scan path can be selected as desired, depending upon various constraints, the most important of which is testing time. In practice, the length of the scan path is typically on the order of 1,000 or more of the latches 50.

Each of the latches 50 is comprised of a first latch circuit 52 labelled L1, and a second latch circuit 54 labelled L2 which has its input connected to the output of the L1 latch circuit 52. Each of the L1 latch circuits 52 includes two inputs for receiving data, a first scan input 56 which receives serially propagated data along the scan path from an L2 output 58 of the previous L1/L2 latch, and a data input 60 which receives data from an output from a corresponding upstream random logic block 62. A plurality of downstream random logic blocks 64 receive as input, outputs 65 from either the L1 latch circuit 52 or L2 latch circuit 54 of the corresponding L1/L2 latch 50.

Three clocks are provided to control operation of the L1/L2 latches 50 during testing of the random logic blocks 62 and 64, and the L1/L2 latches 50 themselves. A first clock known as the A clock is connected via a first clock line 66 to each of the L1 latch circuits 52, and is activated to clock the data on the scan input line 56 into each L1 latch circuit 52. A second clock known as the B clock is connected to each of the L2 latch circuits 54 via a second clock line 68, and is activated to transfer the data in the L1 latch circuit 52 to the L2 latch circuit 54. Finally, a third clock known as the C clock is connected via a third clock line 70 to each of the L1 latch circuits 52 which is activated to transfer the output data from the upstream random logic block 62 into the corresponding L1 latch circuit 52.

During testing, test data is propagated into the scan path by alternate repetitive actuation of the A and B clocks for application of control test data to the downstream random logic blocks 64. Once the test data has been loaded into the scan path, the C clock is activated once to load the outputs from the upstream random logic blocks 62 into the L1/L2 latches 50, and this provides the necessary observability of the upstream logic. The resulting data stream is then propagated out of the scan path for analysis, again through alternate repetitive activation of the A and B clocks.

The memory device 10 illustrated in FIG. 1 can be implemented with a plurality of the L1/L2 latches 50 of FIG.

2 so that the memory device 10 is interposed between the upstream random logic blocks 62 and the downstream random logic blocks 64. Each of the cells or bits in the data words 12 would therefore be implemented by one of the L1/L2 latches 50, and those in Word 0 and Word 1 would remain selected and in the scan path during the scan bypass mode to provide the necessary observability of the upstream random logic block 62 and the controllability of the downstream random logic block 64.

Turning now to FIG. 3, an eight word, four bit, decode two, single write port, compilable Register Array (RA) 100 is illustrated which is constructed in accordance with a preferred embodiment of the present invention. The RA 100 is comprised of eight four bit memory quad cells labelled 102, 104, 106, 108, 110, 112, 114 and 116. Each of the memory quad cells is formed of four L1/L2 latches, for one bit of each of four of the data words. For example, the first memory quad cell 102 forms the Row 0 bits for the first four words WD0, WD1, WD2 and WD3. Each cell is thus identified in FIG. 3 by a word number followed by a row number as illustrated.

As is conventional, each of the data words is addressed using decoder logic. In the specific case of the eight word RA 100, three decoder bits, A2, A1 and A0 are employed to select or address each word. The first two bits, A2 and A1, are employed to select one of four word lines labelled Word Line 0, Word Line 1, Word Line 2 and Word Line 3. The third bit, A0 (not illustrated), is employed to select the upper or lower word for each of the Bit Rows 0, 1, 2 and 3.

In the embodiment illustrated in FIG. 3, three scan chains or paths labelled Scan Chain 1, Scan Chain 2 and Scan Chain 3, are employed to connect each of the L1/L2 latches which form the cells in each of the eight memory quad cells 102–116. Scan Chain 1 is connected in a conventional manner, and interconnects the plurality of latches in the first four memory quad cells 102, 104, 106 and 108 as indicated by the lines, arrows and labels in FIG. 3. An input buffer 120 and an output buffer 122 are provided at the input and output, respectively, of Scan Chain 1 as is conventional.

Scan Chain 2 is employed to interconnect the plurality of latches in the memory quad cells 114 and 116, while Scan Chain 3 is employed to interconnect the plurality of latches in the memory quad cells 110 and 112. First and second I/O circuits 124 and 126 are provided for controlling the flow of test data through Scan Chain 2 and Scan Chain 3, respectively. Each of the I/O circuits 124 and 126 includes a 2:1 multiplexor circuit 128. Each of the multiplexors 128 includes two inputs labelled D1 and D0, with the D1 input being connected to the output of a scan input buffer 130, and the D0 input being connected to the output of the last memory cell latch in the scan chain. A control input S0 is connected to a bypass control line 132. The signal on the bypass control line 132 goes high during the bypass mode which causes each of the multiplexors 128 to connect the D1 input directly to the scan output SOUT, thereby bypassing each of the latches in Scan Chains 2 and 3. When the scan bypass mode is not active, the D0 input of each of the multiplexors 128 is connected to the corresponding scan output SOUT, thereby inserting all of the latches in Scan Chains 2 and 3 in the scan path.

Additional decoder logic is also provided to insure that none of the bypassed data words are selected or addressed during the bypass mode. This logic includes first, second and third three input AND gates 134, 136 and 138 which have their outputs connected to Word Lines 1, 2 and 3, respectively. The bypass control signal supplies a "1" input to each of the three AND gates 134, 136 and 138 through an inverter 140. This causes each of the outputs from the three AND gates 134, 136 and 138 to be zero when the signal on the bypass line goes high during the bypass mode, thereby preventing the words on Word Lines 1, 2 and 3 from being selected. During the non-bypass mode, the A1 true (A1T), A1 complement (A1C), A2 true (A2T), and A2 complement (A2C) values are used as inputs to the AND gates 134, 136 and 138 as indicated to cause appropriate selection of the word lines in the conventional manner.

A two input AND gate 142 receives as input the A1C and A2C values, and has its output connected to a first input of a two input OR gate 144, which in turn has its output connected to Word Line 0. The second input of the OR gate 144 receives the bypass control signal through the inverter 140 and a second inverter 146. During bypass mode when the bypass control signal goes high, the OR gate 144 causes Word Line 0 to be selected, regardless of the value of the decoder bits A1 and A2, so that data entering the RA 100 will be latched into either WD0 or WD1, depending on the bit line decode.

To summarize the operation of the RA 100, activation of the bypass mode causes the signal on the bypass line 132 to go high, thereby causing the multiplexors 128 to bypass all of the latches in Scan Chains 2 and 3, and direct the scan data on the SIN inputs directly to the scan outputs SOUT. At the same time, the output from the inverter 140 goes low, thereby holding each of the Word Lines 1, 2 and 3 inactive. Further, the output from the second inverter 146 goes high, thereby forcing Word Line 0 to be active, regardless of the decoder inputs A1 and A2. In this manner, only words WD0-WD3 in Scan Chain 1 are inserted in the scan path, and this provides the necessary controllability of any logic downstream of the RA 100, as well as the necessary observability of any upstream logic. Finally, during the non-bypass mode, the RA 100 operates in a conventional manner with all of the data words being inserted in the scan path, and normal operation of the decoder circuitry.

In summary, the present invention provides an improved scan bypass architecture for use with scannable memory devices which avoids the need for external dedicated logic components that require additional chip area and degrade performance. More particularly, the need for dedicated listening latches is completely eliminated by employing in their place, the latches in the small number of data words selected during bypass mode. In addition, this design avoids the need for output multiplexors which introduce additional gate delays, and thereby degrade performance of the memory devices.

Although the invention has been disclosed in terms of a preferred embodiment, it will be understood that numerous modifications and variations could be made thereto without departing from the scope of the invention as defined in the following claims. For example, although the preferred embodiment is implemented using an LSSD based design, the inventive concept can also be implemented using any other scan design scheme as well.

What is claimed is:

1. An integrated circuit device comprising:
   a scannable memory array device having a plurality of data words;
   the plurality of data words having a first group of data words and a second group of data words, the first group of data words having a first data word and a last data word, the second group of data words having a first data word and a last data word;

a scan input connected to the first data word of the first data group;

a scan output;

a switching device having first and second inputs and an output, the first input of the switching device coupled to the last word of the first group of the data words by a bypass line, the second input of the switching device coupled to the last word of the second group of the data words;

and the output of the switching device connected to the scan output.

2. The device of claim 1 wherein the switching device comprises a multiplexer.

3. The device of claim 1 further comprising a decoder device responsive to a control signal to select only the first group of data words and to deselect the second group of data words.

4. The device of claim 1 further comprising a data-in bus to transmit data from upstream circuity to the first group of data words in a bypass mode.

5. The device of claim 1 further comprising a data-out bus to transmit data from the first group of data words to downstream circuitry in a bypass mode.

6. The device of claim 1 wherein the data words comprise scannable latches.

7. An integrated circuit device comprising:

a scannable memory array device having a first scan chain and a second scan chain, the first scan chain having a first data word and a last data word;

a first scan input connected to the first data word of the first scan chain;

a first scan output connected to the last data word of the first scan chain;

the second scan chain having a first data word and a last data word;

a second input connected to the first data word of the second scan chain;

a second output connected to the last data word of the second scan chain;

the first and second scan chain being scannable in a non-bypass mode; and the first scan chain only being scannable in a bypass mode, and the second input of the second scan chain coupled to the second output scan chain in the bypass mode.

8. The device of claim 7 further comprising a third scan chain having a first data word and a second data word, the third scan chain only being scannable in a non-bypass mode.

9. The device of claim 7 further comprising more than two scan chains.

10. The device of claim 7 further comprising a decoder device responsive to a control signal to only select the first scan chain and to deselect the second scan chain.

11. The device of claim 7 further comprising a data-in bus to transmit data from upstream circuitry to the first scan chain during the bypass mode.

12. The device of claim 7 further comprising a data-out bus to transmit data from the, first group of data words to downstream circuitry in the bypass mode.

13. The device of claim 7 wherein the data words comprise scannable latches.

* * * * *